US008073080B2

(12) United States Patent
Li et al.

(10) Patent No.: US 8,073,080 B2
(45) Date of Patent: Dec. 6, 2011

(54) METHOD AND SYSTEM FOR RC-CR QUADRATURE GENERATION WITH WIDEBAND COVERAGE AND PROCESS COMPENSATION

(75) Inventors: Qiang Li, Irvine, CA (US); Razieh Roufoogaran, Venice, CA (US); Keith Carter, Rancho Palos Verdes, CA (US); Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 723 days.

(21) Appl. No.: 11/618,720

(22) Filed: Dec. 29, 2006

(65) Prior Publication Data

US 2008/0137785 A1    Jun. 12, 2008

Related U.S. Application Data

(60) Provisional application No. 60/868,818, filed on Dec. 6, 2006.

(51) Int. Cl.
*H03D 3/00* (2006.01)
*H04L 27/22* (2006.01)

(52) U.S. Cl. .......... 375/332; 329/304; 329/337

(58) Field of Classification Search .......... 375/279–281, 375/308, 324–326, 329, 332; 329/304, 305, 329/336–339, 344, 345; 332/103–105, 144, 146; 455/23, 42, 125, 205
See application file for complete search history.

(56) References Cited

U.S. PATENT DOCUMENTS

| 7,184,737 | B2 * | 2/2007 | Liu | 455/302 |
| 2002/0177425 | A1 * | 11/2002 | Li | 455/296 |
| 2003/0132455 | A1 * | 7/2003 | Utsunomiya et al. | 257/200 |
| 2003/0181187 | A1 * | 9/2003 | Liu | 455/302 |
| 2003/0224747 | A1 * | 12/2003 | Anand | 455/208 |
| 2006/0229052 | A1 * | 10/2006 | De Ruijter | 455/313 |

* cited by examiner

*Primary Examiner* — Young T. Tse
(74) *Attorney, Agent, or Firm* — Thomas, Kayden, Horstemeyer & Risley, LLP

(57) ABSTRACT

Certain aspects of a method and system for RC-CR quadrature generation with wideband coverage and process compensation may include determining an amplitude mismatch between an in-phase (I) component and a quadrature (Q) component of a signal generated in a radio frequency (RF) transmitter or receiver. A variation in resistance of a quadrature network associated with the I component and Q component may be determined. The determined amplitude mismatch and the determined variation in the resistance of the quadrature network may be compensated by adjusting a resistance of a portion of the quadrature network associated with the I component and a resistance of a portion of the quadrature network associated with the Q component.

33 Claims, 8 Drawing Sheets

US 8,073,080 B2

METHOD AND SYSTEM FOR RC-CR QUADRATURE GENERATION WITH WIDEBAND COVERAGE AND PROCESS COMPENSATION

CROSS-REFERENCE TO RELATED APPLICATIONS/INCORPORATION BY REFERENCE

This patent application makes reference to, claims priority to and claims benefit from U.S. Provisional Patent Application Ser. No. 60/868,818, filed on Dec. 6, 2006.

This application makes reference to:
U.S. application Ser. No. 11/618,716 filed Dec. 29, 2006;
U.S. application Ser. No. 11/618,721 filed Dec. 29, 2006;
U.S. application Ser. No. 11/618,719 filed Dec. 29, 2006; and
U.S. application Ser. No. 11/618,863 filed Dec. 31, 2006.

Each of the above stated applications is hereby incorporated by reference in its entirety.

FIELD OF THE INVENTION

Certain embodiments of the invention relate to communication systems. More specifically, certain embodiments of the invention relate to a method and system for RC-CR quadrature generation with wideband coverage and process compensation.

BACKGROUND OF THE INVENTION

The development and design of radio receivers, transmitters, and/or transceiver systems has been driven by the great demand for devices for mobile wireless communication applications, especially handset devices. With the ever decreasing size of mobile handsets and an ever increasing demand for voice, data, and/or video processing capabilities, there is a growing need to develop radio receivers and transmitters that not only meet these challenging performance requirements, but that do so in smaller integrated circuit (IC) footprints, that is, at lower cost, and with greater power efficiency. One approach that aims at addressing these demands is the development of highly integrated receivers, transmitters, and/or transceivers in complementary metal oxide semiconductor (CMOS) technology to minimize the number of off-chip components.

As a result of these highly integrated systems, radio receivers, transmitters, and/or transceivers may comprise a large number of components and/or circuits, which may be utilized for the processing of signals. The design of optimal systems may require that these components and/or circuits operate within certain requirements or constraints for a wide range of operational conditions. For example, power amplifiers (PA) and/or low noise amplifiers (LNA) may be required to operate at an optimal gain level. However, this gain level may vary significantly based on operational conditions, such as temperature and/or voltage supplies, or based on manufacturing conditions, such as the non-uniformity in transistor parameters that result from normal variations in the manufacturing process. These variations generally referred to as process, voltage, and temperature (PVT) variations, may have a significant effect in the overall performance of wireless handsets.

In systems based on the global system for mobile communications (GSM) standard, for example, PVT variations in many of the circuits and/or components utilized in the receiver or the transmitter may produce errors in the generation of "I" (in-phase) and "Q" (quadrature) signal components. These errors may result in a significant degradation in the signal-to-noise ratio (SNR) and/or the bit-error-rate (BER) performance of GSM handsets.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for RC-CR quadrature generation with wideband coverage and process compensation, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for RC-CR quadrature generation with wideband coverage and process compensation. Aspects of the method and system may comprise determining an amplitude mismatch between an in-phase (I) component and a quadrature (Q) component of a signal generated in a radio frequency (RF) transmitter or receiver. A variation in resistance of a quadrature network associated with the I component and Q component may be determined. The determined amplitude mismatch and the determined variation in the resistance of the quadrature network may be compensated by adjusting a resistance of a portion of the quadrature network associated with the I component and a resistance of a portion of the quadrature network associated with the Q component.

Figure 1:
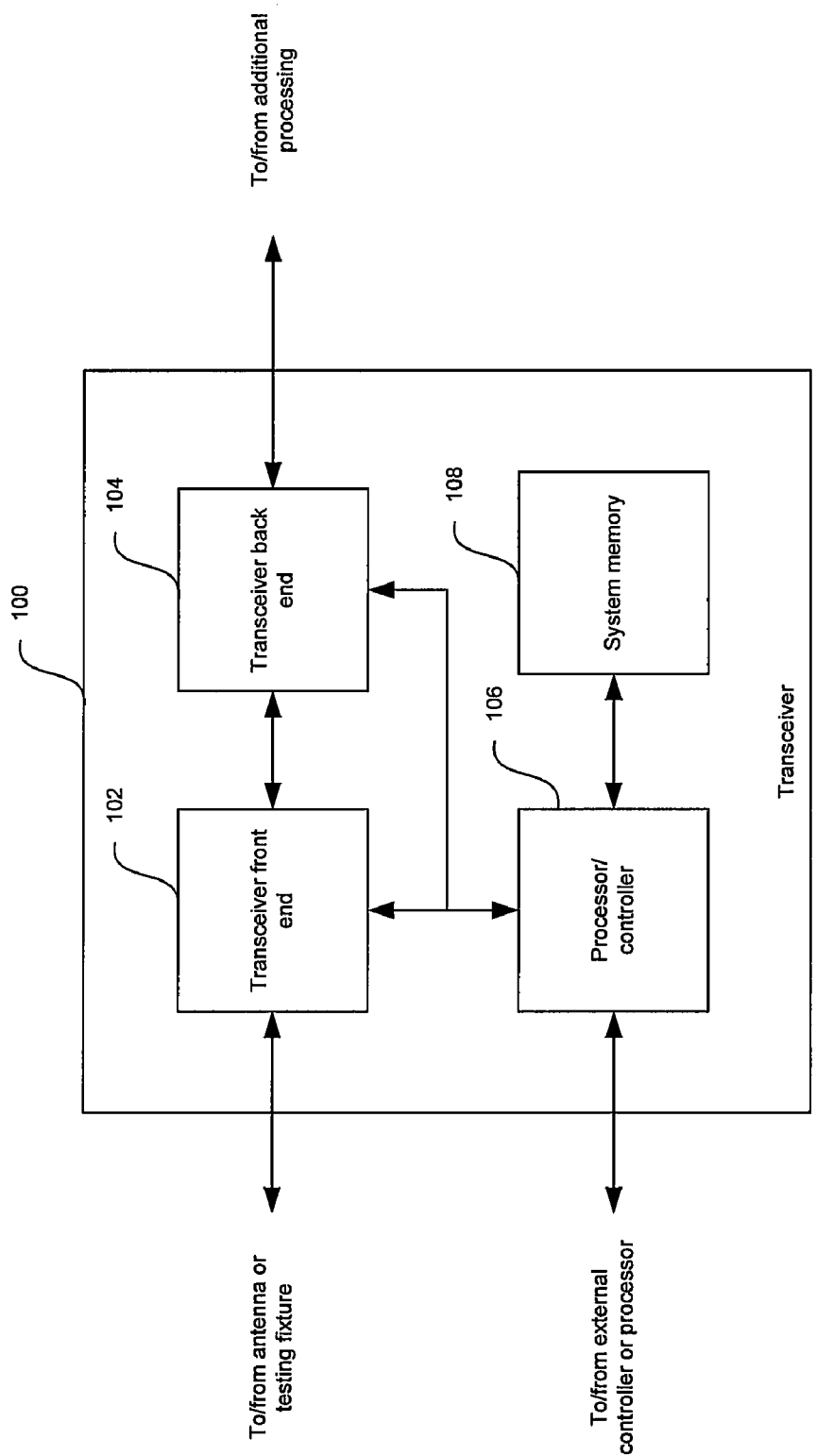
FIG. 1 is a block diagram of an exemplary RF transceiver system, in accordance with an embodiment of the invention.

FIG. 1 is a block diagram of an exemplary RF transceiver system, in accordance with an embodiment of the invention. Referring to FIG. 1, the RF transceiver system 100 may comprise a transceiver front end 102, a transceiver back end 104, a controller/processor 106, and a system memory 108. The transceiver front end 102 may comprise suitable logic, circuitry, and/or code that may be enabled to receive and/or transmit an RF signal. The transceiver front end 102 may comprise a receiver portion and a transmitter portion. Both the transmitter portion and the receiver portion may be coupled to an external antenna for signal broadcasting and signal reception respectively. The transceiver front end 102 may modulate a signal for transmission and may also demodulate a received signal before further processing of the received signal is to take place. Moreover, the transceiver front end 102 may provide other functions, for example, digital-to-analog conversion, analog-to-digital conversion, frequency downsampling, frequency upsampling, and/or filtering.

The transceiver back end 104 may comprise suitable logic, circuitry, and/or code that may be enabled to digitally process received signals from the transceiver front end 104 and/or to process signals received from at least one processing block, which may be located external to the RF transceiver system 100. The controller/processor 106 may comprise suitable logic, circuitry, and/or code that may be enabled to control the operations of the transceiver front end 102 and/or the transceiver back end 104. For example, the controller/processor 106 may be utilized to update and/or modify programmable parameters and/or values in a plurality of components, devices, and/or processing elements in the transceiver front end 102 and/or in the transceiver back end 104. Control and/or data information may be transferred from at least one controller and/or processor external to the RF transceiver system 100 to the controller/processor 106 during the operation of the RF transceiver system 100. Moreover, the controller/processor 106 may also transfer control and/or data information to at least one controller and/or processor external to the RF transceiver system 100.

The controller/processor 106 may utilize the received control and/or data information to determine the mode of operation of the transceiver front end 102. For example, the controller/processor 106 may be enabled to select between measuring and storing a nominal parameter that corresponds to a nominal set of operating process or temperature conditions or measuring and storing a plurality of parameters that correspond to a plurality of operating process or temperature conditions. Moreover, the controller/processor 106 may be enabled to determine a value of a transistor transconductance parameter β, or a value of a parameter that may correspond to β, as representative of the process or temperature conditions that existed when the measurement took place. The values determined for β, and/or for parameters that may correspond to β, may be transferred to the system memory 108, for example, from the controller/processor 106. The controller/processor 106 may also be enabled to compare a current reading of β, for example, that corresponds to a current set of process or temperature operating conditions, to stored readings of β, that correspond to known process or temperature operating conditions. This comparison may be utilized to determine whether the operating settings for certain portions of the transceiver front end 102 may need correction as operating conditions vary. The system memory 108 may comprise suitable logic, circuitry, and/or code that may be enabled to store a plurality of control and/or data information, including values that may correspond to readings and/or measurements of the transconductance parameter β performed during PVT measurement and calibration operations.

Figure 2:
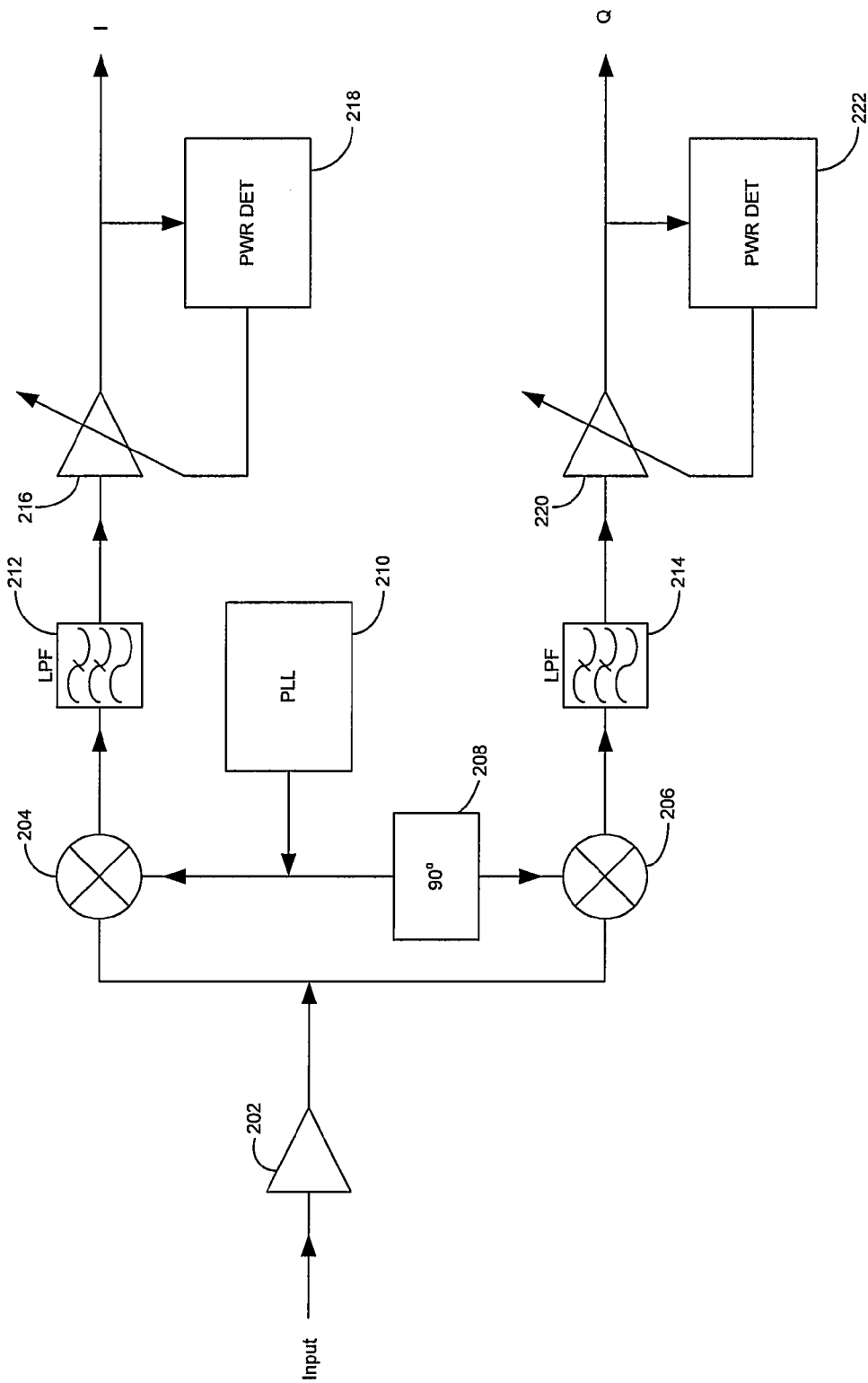
FIG. 2 is a block diagram of a direct-conversion receiver that may be utilized in connection with an embodiment of the invention.

FIG. 2 is a block diagram of a direct-conversion receiver that may be utilized in connection with an embodiment of the invention. Referring to FIG. 2, there is shown an amplifier 202, a plurality of mixers 204 and 206, a plurality of low pass filters 212 and 214, a plurality of linear gain amplifiers 216 and 220, a plurality of power detectors 218 and 222, a phase splitter 208 and a phase locked loop (PLL) 210.

The amplifier 202 may be enabled to receive an input signal and may generate an amplified output signal to the plurality of mixers 204 and 206. The plurality of mixers 204 and 206 may be enabled to downconvert the analog RF substreams to baseband. The phase splitter 208 may be enabled to determine whether ensure the mixer local oscillator inputs are in quadrature, indicating that they are 90 degrees out of phase with respect to each other. Alternatively, one path may be shifted by positive (+) 45 degrees and the other path may be shifted by negative (−) 45 degrees, for example.

The phase locked loop 210 may be enabled to drive the mixer local oscillator inputs and the phase splitter 208. The plurality of low pass filters 212 and 214 may be enabled to filter the received signals in order to allow a desired channel of frequencies. The plurality of linear gain amplifiers 216 and 220 may be enabled to maintain a constant amplitude of the received signals and may be controlled by the plurality of power detectors 218 and 222 and generate the I and Q components of the received signal.

Figure 3:
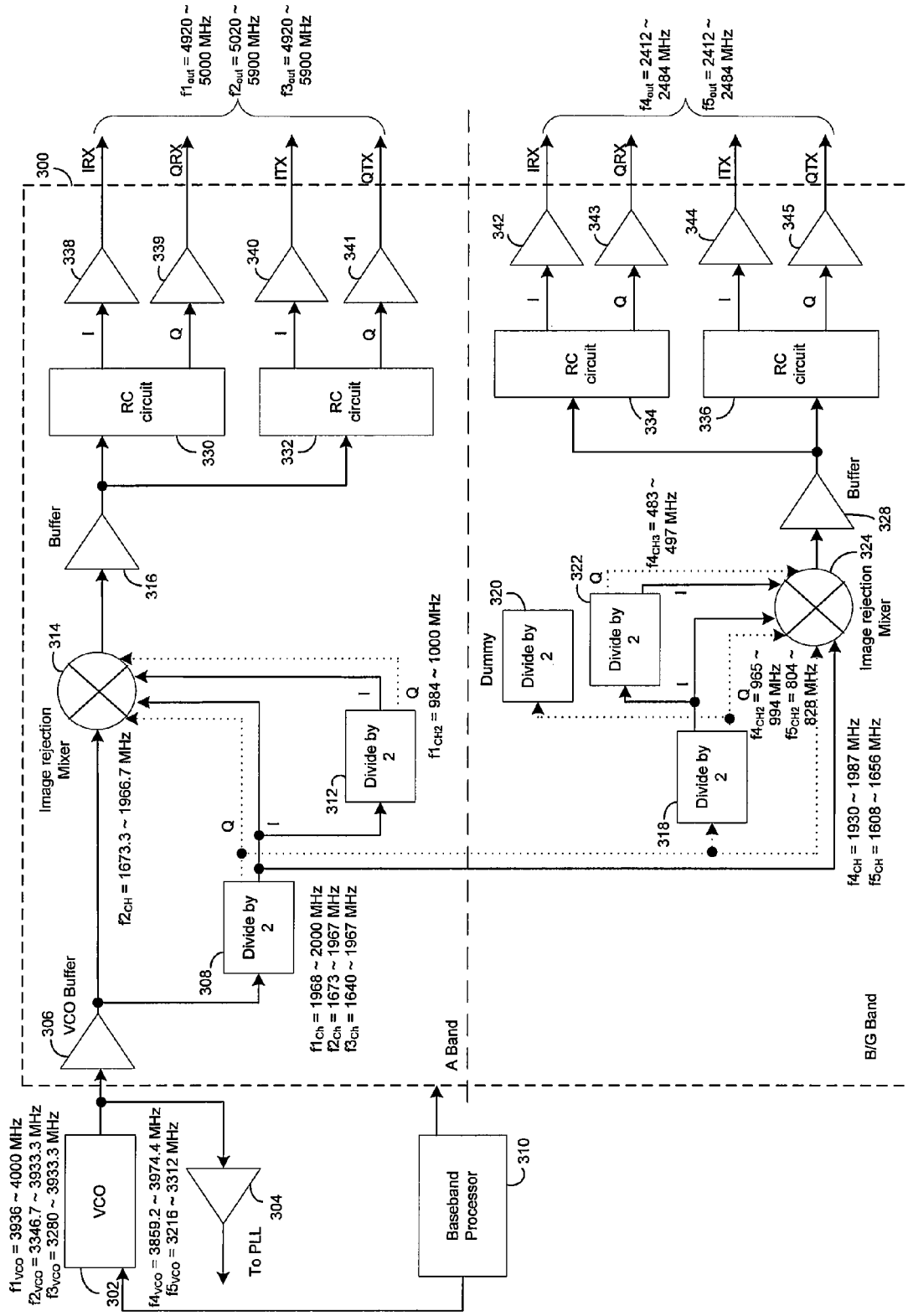
FIG. 3 is a block diagram of an exemplary local oscillator generator architecture for multi-standard wireless communication systems, in accordance with an embodiment of the invention.

FIG. 3 is a block diagram of an exemplary local oscillator generator architecture for multi-standard wireless communication systems, in accordance with an embodiment of the invention. Referring to FIG. 3, there is shown a VCO 302, a buffer 304, a processor 310, and a LO generator 300. The LO generator 300 may comprise a VCO buffer 306, a plurality of image rejection mixers 314 and 324, a plurality of divide by 2 circuits 308, 312, 318, 320, and 322, a plurality of buffers 316 and 328, a plurality of RC circuits 330, 332, 334, and 336, and a plurality of last stage buffers 338, 339, 340, 341, 342, 343, 344, and 345.

The VCO 302 may comprise suitable logic, circuitry, and/or code that may be enabled to generate an output frequency that may be a multiple of the frequency of a reference oscillator. The VCO 302 may be enabled to operate in a plurality of frequency ranges. For example, the VCO 302 may be enabled to operate in a first frequency range, $f1_{VCO}$ of about 3936 MHz to 4000 MHz in divide by 4 mode to generate an output frequency range $f1_{out}$ of about 4920 MHz to 5000 MHz, where $f1_{out}=f1_{VCO}\times 5/4$, for example, a second frequency range, $f2_{VCO}$ of about 3346.7 MHz to 3933.3 MHz in divide by 2 mode to generate an output frequency range $f2_{out}$ of about 5020 MHz to 5900 MHz, where $f2_{out}=f2_{VCO}\times 3/2$, for example, and a third frequency range, $f3_{VCO}$ of about 3280 MHz to 3933.3 MHz in divide by 2 mode to generate an output frequency range $f3_{out}$ of about 4920 MHz to 5900 MHz, where $f3_{out}=f3_{VCO}\times 3/2$, for example, for 802.11a band WLAN operation.

The VCO 302 may be enabled to operate in a fourth frequency range, $f4_{VCO}$ of about 3859.2 MHz to 3974.4 MHz in divide by 8 mode to generate an output frequency range $f4_{out}$ of about 2412 MHz to 2484 MHz, where $f4_{out}=f4_{VCO}\times 5/8$, for example, and a fifth frequency range, $f5_{VCO}$ of about 3216 MHz to 3312 MHz in divide by 4 mode to generate an output frequency range $f5_{out}$ of about 2412 MHz to 2484 MHz, where $f5_{out}=f5_{VCO}\times 3/4$, for example, for 802.11b/g band WLAN operation. The buffer 304 may be enabled to receive a signal from the VCO 302 and generate an output to a PLL in the same frequency range as VCO 302.

The baseband processor 310 may comprise suitable logic, circuitry, and/or code that may be enabled to select LO generator 300 divider configurations depending on a required output frequency range and an input frequency range of operation at VCO 302 based on a particular wireless band of operation, for example, 802.11a/b/g wireless band of operation. The VCO buffer 306 may comprise suitable logic, circuitry, and/or code that may be enabled to buffer and/or store the received signals from the VCO 302. The plurality of divide by 2 circuits 308, 312, 318, 320, and 322 may comprise suitable logic, circuitry, and/or code that may be enabled to generate the in-phase (I) and quadrature (Q) components of a received signal, and may output the generated I and Q components to a plurality of mixers.

The divide by 2 circuit 308 may be enabled to divide the frequency of the received input signal from the VCO 302 and generate an output signal with half the frequency of the received input signal. For example, the divide by 2 circuit 308 may generate I and Q components of an output signal in the frequency range, $f1_{CH}$ of about 1968 MHz to 2000 MHz, for example, for 802.11a band WLAN operation in divide by 4 mode and VCO range of $f1_{VCO}$. The divide by 2 circuit 308 may generate I and Q components of an output signal in the frequency range, $f2_{CH}$ of about 1673 MHz to 1967 MHz, for example, for 802.11a band WLAN operation in divide by 2 mode and VCO range of $f2_{VCO}$.

The divide by 2 circuit 308 may generate I and Q components of an output signal in the frequency range, $f3_{CH}$ of about 1640 MHz to 1967 MHz, for example, for 802.11a band WLAN operation in divide by 2 mode and VCO range of $f3_{VCO}$. The divide by 2 circuit 308 may generate I and Q components of an output signal in the frequency range, $f4_{CH}$ of about 1930 MHz to 1987 MHz, for example, for 802.11b/g band WLAN operation in divide by 8 mode and VCO range of $f4_{VCO}$. The divide by 2 circuit 308 may generate I and Q components of an output signal in the frequency range, $f5_{CH}$ of about 1608 MHz to 1656 MHz, for example, for 802.11b/g band WLAN operation in divide by 4 mode and VCO range of $f5_{VCO}$.

The divide by 2 circuit 312 may be enabled to divide the frequency of the received I component of the output signal from the divide by 2 circuit 308 and generate an output signal with half the frequency of the received input signal. For example, the divide by 2 circuit 312 may generate I and Q components of an output signal in the frequency range, $f1_{CH2}$ of about 984 MHz to 1000 MHz, for example, for 802.11a band WLAN operation in divide by 4 mode and VCO range of $f1_{VCO}$.

The divide by 2 circuit 318 may be enabled to divide the frequency of the received Q component of the output signal from the divide by 2 circuit 308 and generate an output signal with half the frequency of the received input signal for 802.11b/g band WLAN operation. The divide by 2 circuit 318 may generate I and Q components of an output signal in the frequency range, $f4_{CH2}$ of about 965 MHz to 994 MHz, for example, in divide by 8 mode and VCO range of $f4_{VCO}$. The divide by 2 circuit 318 may generate I and Q components of an output signal in the frequency range, $f5_{CH2}$ of about 804 MHz to 828 MHz, for example, in divide by 4 mode and VCO range of $f5_{VCO}$. The divide by 2 circuit 322 may be enabled to divide the frequency of the received I component of the output signal from the divide by 2 circuit 318 and generate an output signal with half the frequency of the received input signal for 802.11b/g band WLAN operation. For example, the divide by 2 circuit 322 may generate I and Q components of an output signal in the frequency range, $f4_{CH3}$ of about 482 MHz to 497 MHz, for example for 802.11b/g band WLAN operation in divide by 8 mode and VCO range of $f4_{VCO}$.

The divide by 2 circuit 320 may be a dummy circuit and may be enabled to receive the Q component of the output signal from the divide by 2 circuit 318. The Q component generated by the divide-by-two circuit 318 may be coupled to the dummy load or divide by 2 circuit 320 with negligible power consumption. This results in symmetric loading of the divide-by-two circuit 318 and perfect I-Q matching. The dummy load may comprise a load that is equivalent to the divide by 2 circuit 322.

The divide by 2 circuit 308 may be symmetrically loaded. For example, the I component of the divide by 2 circuit 308 may be coupled to a divide by 2 circuit 312 and the plurality of image rejection mixers 314 and 324. Similarly, the Q component of the divide by 2 circuit 308 may be coupled to a divide by 2 circuit 318 and the plurality of image rejection mixers 314 and 324.

The image rejection mixer 314 may comprise suitable logic, circuitry, and/or code that may be enabled to mix the frequencies of the received signals from the VCO 302 and at least one of the plurality of divide by 2 circuits 308 and 312 to generate an output signal to the buffer 316. The image rejection mixer 314 may be enabled to suppress unwanted images of frequencies by processing the received signal and image differently. The image rejection mixer 314 may be enabled to receive the I and Q components of the output signals generated by the plurality of divide by 2 circuits 308 and 312. The image rejection mixer 314 may be enabled to generate an output signal for the particular wireless band of operation based on mixing a plurality of received signals within a selected frequency range. The buffer 316 may be enabled to generate a buffered output of the received signal from the image rejection mixer 314 to the plurality of RC circuits 330 and 332. The baseband processor 310 may be enabled to select at least one of the plurality of signals received from the plurality of divide by 2 circuits 308 and 312. For example, the image rejection mixer 314 may be enabled to mix the frequency of the received signal from the VCO buffer 306, and one of the frequencies of the I and Q components of the received signal from the divide by 2 circuit 308, and the frequency of the I and Q components of the received signal from the divide by 2 circuit 312 to generate an output signal to the buffer 316.

The image rejection mixer 324 may comprise suitable logic, circuitry, and/or code that may be enabled to mix the frequencies of the received signals from the divide by 2 circuit 308 and at least one of the plurality of divide by 2 circuits 318 and 322 to generate an output signal to the buffer 328. The image rejection mixer 324 may be enabled to suppress unwanted images of frequencies by processing the received signal and image differently. The image rejection mixer 324 may be enabled to receive the I and Q components of the output signals generated by the plurality of divide by 2 circuits 308, 318, and 322. The image rejection mixer 324 may be enabled to generate an output signal for the particular wireless band of operation based on mixing a plurality of received signals within a selected frequency range. The buffer 328 may be enabled to generate a buffered output of the received signal from the image rejection mixer 324 to the plurality of RC circuits 334 and 336. The baseband processor 310 may be enabled to select at least one of the plurality of signals received from the plurality of divide by 2 circuits 318 and 322. For example, the image rejection mixer 324 may be enabled to mix the frequency of the I and Q components of the received signal from the divide by 2 circuit 308, and one of the frequencies of the I and Q components of the received signal from the divide by 2 circuit 318 and the frequency of the I and Q components of the received signal from the divide by 2 circuit 322 to generate an output signal to the buffer 328.

The plurality of RC circuits 330 and 332 may comprise suitable logic, circuitry, and/or code that may be enabled to generate I and Q components of a received signal to the plurality of last stage buffers 338, 339, 340, and 341 by shifting the phase of the received signal from the buffer 316. The plurality of last stage buffers 338, 339, 340, and 341 may be enabled to amplify signals and generate an output to a transmitter/receiver for 802.11a band WLAN operation. The I and Q components of the output signal generated by the plurality of last stage buffers 338, 339, 340 and 341 may be in the frequency range, $f1_{out}$ of about 4920 MHz to 5000 MHz, for example, for 802.11a band WLAN operation in divide by 4 mode and VCO range of $f1_{VCO}$. The I and Q components of the output signal generated by the plurality of last stage buffers 338, 339, 340 and 341 may be in the frequency range, $f2_{out}$ of about 5020 MHz to 5900 MHz, for example, for 802.11a band WLAN operation in divide by 2 mode and VCO range of $f2_{VCO}$. The I and Q components of the output signal generated by the plurality of last stage buffers 338, 339, 340 and 341 may be in the frequency range, $f3_{out}$ of about 4920 MHz to 5900 MHz, for example, for 802.11a band WLAN operation in divide by 2 mode and VCO range of $f3_{VCO}$.

The plurality of RC circuits 334 and 336 may comprise suitable logic, circuitry, and/or code that may be enabled to generate I and Q components of a received signal to the plurality of last stage buffers 342, 343, 344, and 345 by shifting the phase of the received signal from the buffer 328. The plurality of last stage buffers 342, 343, 344, and 345 may be enabled to amplify signals and generate an output to a transmitter/receiver for 802.11b/g band WLAN operation. The I and Q components of the output signal generated by the plurality of last stage buffers 342, 343, 344 and 345 may be in the frequency range, $f4_{out}$ of about 2412 MHz to 2484 MHz, for example, for 802.11b/g band WLAN operation in divide by 8 mode and VCO range of $f4_{VCO}$. The I and Q components of the output signal generated by the plurality of last stage buffers 341, 343, 344, and 345 may be in the frequency range, $f5_{out}$ of about 2412 MHz to 2484 MHz, for example, for 802.11b/g band WLAN operation in divide by 4 mode and VCO range of $f5_{VCO}$.

In a chip handling both WLAN connection and Bluetooth connection, the baseband processor 310 may avoid pulling of the VCO 302 by the second harmonics generated by the VCO 302 by selecting an input frequency range of operation at VCO 302 based on a particular wireless band of operation, for example, 802.11a/b/g wireless band of operation. Similarly, the I and Q components of an output signal generated by the divide by 2 circuit 308 in the frequency range of about 1673.3 MHz to 1966.7 MHz, for example, may not interfere with frequencies of the generated signals of the VCO 302 operating in a Bluetooth mode of operation.

Figure 4:
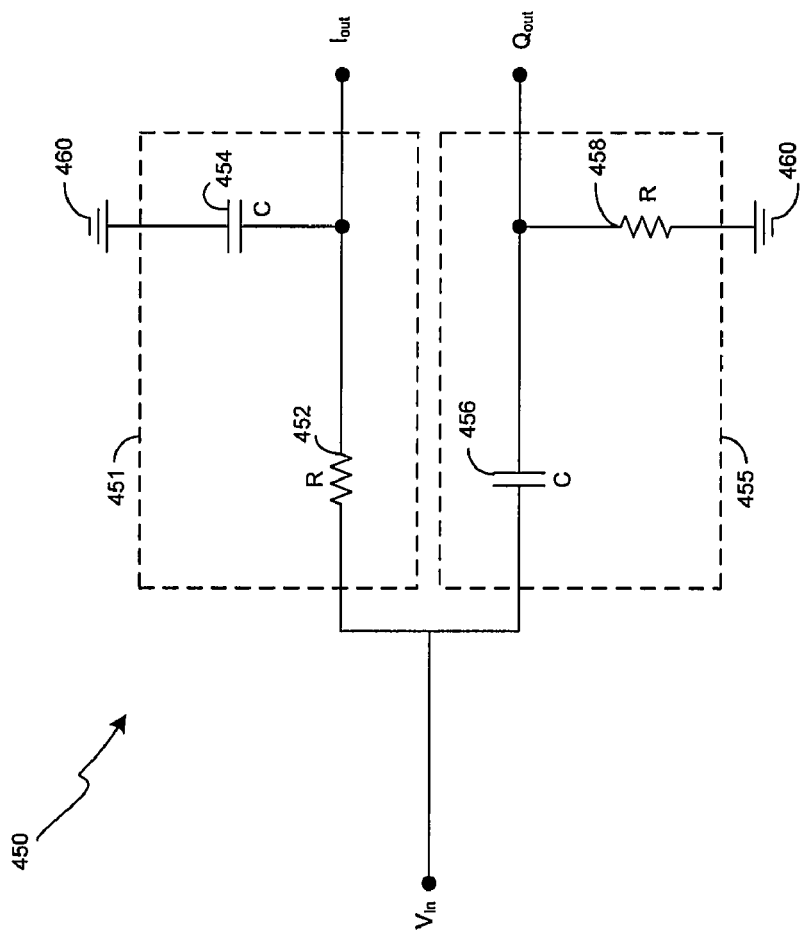
FIG. 4 is a block diagram of an exemplary RC-CR quadrature network that may be utilized in connection with an embodiment of the invention.

FIG. 4 is a block diagram of an exemplary RC-CR quadrature network that may be utilized in connection with an embodiment of the invention. Referring to FIG. 4, there is shown a RC-CR quadrature network 450 that comprises a RC circuit 451 and a CR circuit 455 and a ground (GND) 460. The RC circuit 451 may comprise a resistor R 452 and a capacitor C 454. The CR circuit 455 may comprise a resistor R 458 and a capacitor C 456.

The input $V_{in}$ may be a sinusoidal input signal with frequency ω. The RC circuit 451 comprising R 452 and C 454 may be enabled to generate a phase shifted output $I_{out}$ with amplitude equal to $\pi/2 - \tan^{-1}(RC\omega)$. The CR circuit 455 comprising R 458 and C 456 may be enabled to generate a phase shifted output $Q_{out}$ with amplitude equal to $-\tan^{-1}(RC\omega)$. $I_{out}$ and $Q_{out}$ have a 90 degree phase difference at all frequencies. The amplitude of the output signals, $I_{out}$ and $Q_{out}$ may be equal at $\omega = 1/(RC)$. The RC-CR quadrature network 450 may be utilized to generate the I and Q components of the received signal $V_{in}$.

Figure 5A:
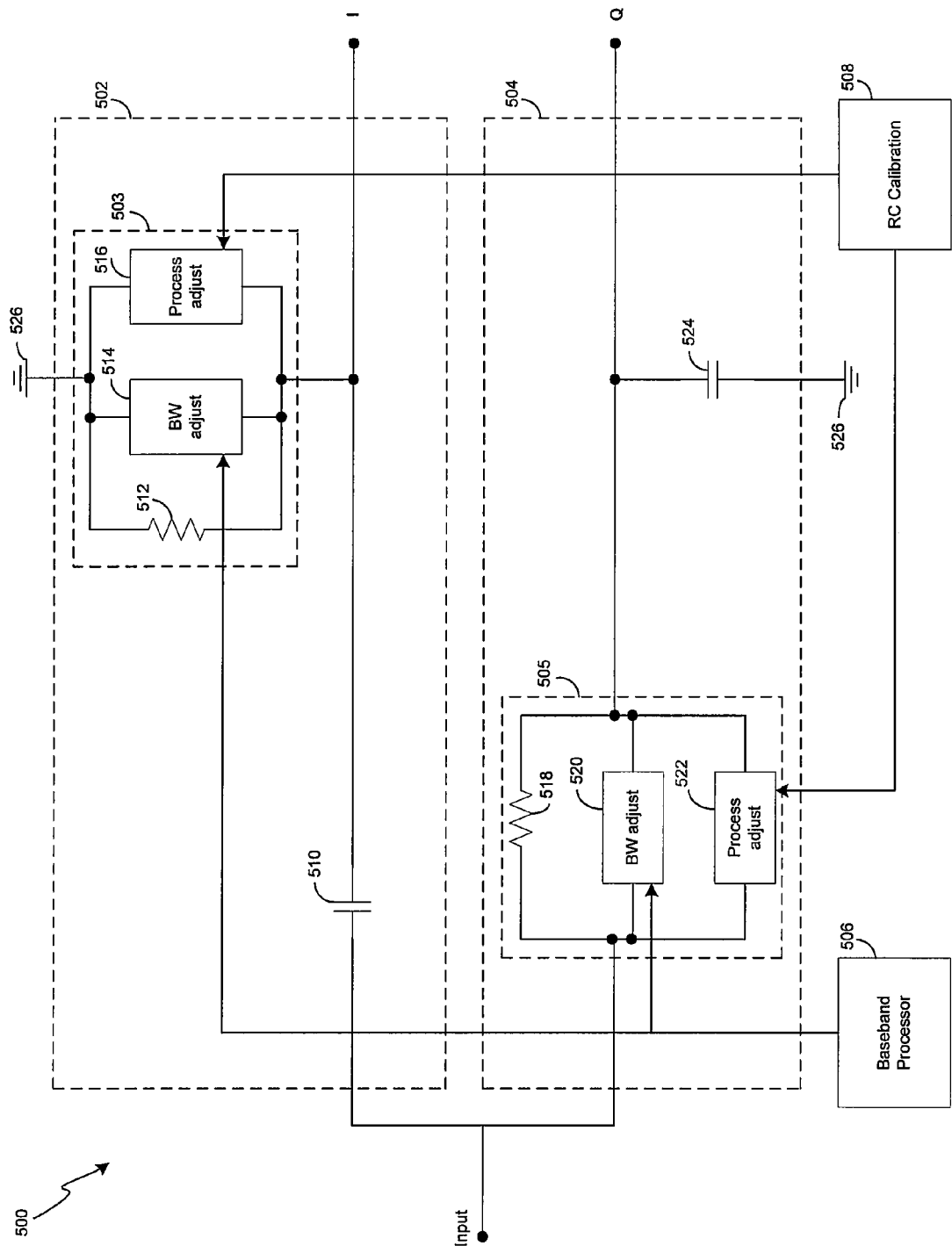
FIG. 5A is a block diagram of an exemplary RC-CR quadrature network with wideband coverage and process compensation, in accordance with an embodiment of the invention.

FIG. 5A is a block diagram of an exemplary RC-CR quadrature network with wideband coverage and process compensation, in accordance with an embodiment of the invention. Referring to FIG. 5A, there is shown a RC-CR quadrature network 500, a baseband processor 506, and a RC calibration block 508. The RC-CR quadrature network 500 comprises a RC network 502 and a CR network 504. The RC network 502 may comprise a capacitor 510 and a resistor network 503. The CR network 504 may comprise a capacitor 524 and a resistor network 505. The resistor network 503 may comprise a base resistor 512, a bandwidth adjustment block 514, and a process compensation adjust block 516. The resistor network 505 may comprise a base resistor 518, a bandwidth adjustment block 520, and a process compensation adjust block 522.

The bandwidth adjustment block 514 may comprise suitable logic, circuitry, and/or code that may be enabled to adjust the bandwidth of operation of the RF transceiver system 100 by adjusting the resistance of the resistor network 503. The bandwidth adjustment block 514 may comprise one or more resistors and transistors. The bandwidth adjustment block 514 may be coupled to the baseband processor 506 and may be enabled to compensate for the amplitude mismatch between the I and Q components of the output signal.

The process compensation adjust block 516 may comprise suitable logic, circuitry, and/or code that may be enabled to compensate for the process or temperature variations in the RF transceiver system 100 by adjusting the resistance of the resistor network 503. The process compensation adjust block 516 may comprise one or more resistors and transistors. The process compensation adjust block 516 may be coupled to the RC calibration block 508. The bandwidth adjustment block 514 and the process compensation adjust block 516 may be placed in parallel to the base resistor 512.

The bandwidth adjustment block 520 may comprise suitable logic, circuitry, and/or code that may be enabled to adjust the bandwidth of operation of the RF transceiver system 100 by adjusting the resistance of the resistor network 505. The bandwidth adjustment block 520 may comprise one or more resistors and transistors. The bandwidth adjustment block 520 may be coupled to the baseband processor 506 and may be enabled to compensate for the amplitude mismatch between the I and Q components of the output signal.

The process compensation adjust block 522 may comprise suitable logic, circuitry, and/or code that may be enabled to compensate for the process or temperature variations in the RF transceiver system 100 by adjusting the resistance of the resistor network 505. The process compensation adjust block 522 may comprise one or more resistors and transistors. The process compensation adjust block 522 may be coupled to the RC calibration block 508. The bandwidth adjustment block 520 and the process compensation adjust block 522 may be placed in parallel to the base resistor 518. The base resistor 518 may be a resistor with variable resistance.

The baseband processor 506 may comprise suitable logic, circuitry, and/or code that may be enabled to compensate for the amplitude mismatch between the I and Q components of the output signal by communicating a control signal to the plurality of bandwidth adjustment blocks 514 and 520 based on the frequency range of operation of the RF transceiver 100.

The baseband processor 506 may comprise two bits, for example, for bandwidth adjustement. Notwithstanding, the baseband processor 506 may utilize a plurality of bits for bandwidth adjustement.

Table 1 illustrates exemplary center frequencies for bandwidth adjustement in a RC-CR quadrature network.

TABLE 1

| Bit Value ($b_1b_0$) | Frequency Range (GHz) | Center Frequency (GHz) |
|---|---|---|
| 0 | 4.9 to 5.15 | 5.025 |
| 1 | 5.15 to 5.4 | 5.275 |
| 2 | 5.4 to 5.65 | 5.55 |
| 3 | 5.65 to 5.9 | 5.775 |

The baseband processor 506 may be enabled to determine the frequency range of operation of the RF transceiver 100 and set the center frequency to a corresponding value to reduce the I-Q amplitude mismatch. For example, if the frequency range of operation is between about 5.15 GHz to 5.4 GHz, the baseband processor 506 may be enabled to set the center frequency to 5.275 GHz by adjusting the resistance of the resistor networks 503 and 505. The amplitude of the I and Q components of the output signal may be equal at frequency ω equal to (1/RC), where R may be the resistance of the resistor network 503 or 505, and C may be the capacitance of the capacitor 510 or 524.

The RC calibration block 508 may comprise suitable logic, circuitry, and/or code that may be enabled to compensate for the process or temperature variations in the RF transceiver system 100 by communicating a control signal to the plurality of process compensation adjust blocks 516 and 522 based on the amount of process or temperature variations in the RF transceiver system 100. The RC calibration block 508 may comprise two bits, for example, for process compensation adjustement. Notwithstanding, the RC calibration block 508 may utilize a plurality of bits for process compensation adjustement.

Table 2 illustrates exemplary adjustment of resistance based on amount of process variation in a RC-CR quadrature network.

TABLE 2

| Bit Value ($b_3b_2$) | Resistance adjustment |
|---|---|
| 0 | 5% |
| 1 | 0 |
| 2 | −5% |
| 3 | −10% |

The RC calibration block 508 may be enabled to determine the amount of process or temperature variation in the RF transceiver 100 and compensate for these process or temperature variations by adjusting the resistance of the resistor network 503 or 505. For example, if the amount of process or temperature variation is 5%, the RC calibration block 508 may be enabled to adjust the resistance of the resistor networks 503 and 505 by adjusting the resistance of the process compensation adjust blocks 516 or 522.

In accordance with an embodiment of the invention, the RC-CR quadrature network 500 may be enabled to generate I and Q components of the received input signal with minimal I-Q amplitude mismatch by compensating for process or temperature variations in the RC-CR quadrature network 500 and by adjusting the center frequency based on a frequency range of operation of the RF transceiver 100. In accordance with an embodiment of the invention, the resistance of the resistor networks 503 and 505 may be adjusted simultaneously based on the control signals communicated by the baseband processor 506 and the RC calibration block 508.

Figure 5B:
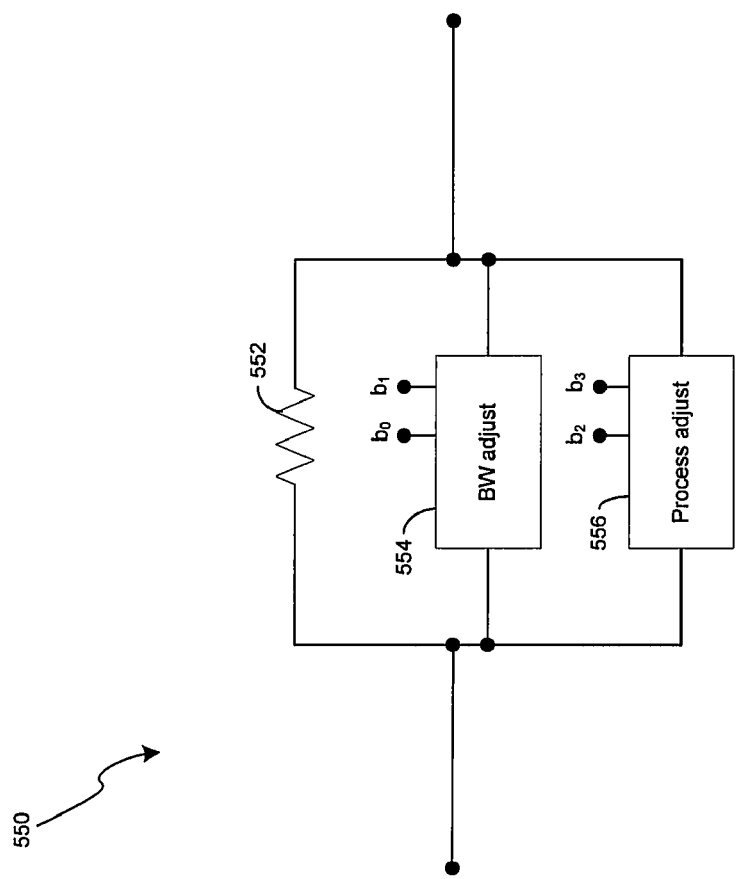
FIG. 5B is a block diagram of an exemplary portion of a resistor network with wideband coverage and process compensation, in accordance with an embodiment of the invention.

FIG. 5B is a block diagram of an exemplary portion of a resistor network with wideband coverage and process compensation, in accordance with an embodiment of the invention. Referring to FIG. 5B, there is shown a resistor network 550 that comprises a base resistor 552, a bandwidth adjustment block 554, and a process compensation adjust block 556.

The bandwidth adjustment block 554 may comprise suitable logic, circuitry, and/or code that may be enabled to adjust the bandwidth of operation of the RF transceiver system 100 by adjusting the resistance of the resistor network 550. The bandwidth adjustment block 554 may comprise one or more resistors and transistors. The bandwidth adjustment block 554 may be coupled to a process compensation adjust block 556 and may be enabled to compensate for the amplitude mismatch between the I and Q components of the output signal. The bandwidth adjustment block 554 may be controlled based on the values of input parameters $b_0$ and $b_1$, for example. The baseband processor 506 may be enabled to set the values of $b_0$ and $b_1$ based on the particular center frequency required to reduce the I-Q amplitude mismatch.

The process compensation adjust block 556 may comprise suitable logic, circuitry, and/or code that may be enabled to compensate for the process or temperature variations in the RF transceiver system 100 by adjusting the resistance of the resistor network 550. The process compensation adjust block 556 may comprise one or more resistors and transistors. The process compensation adjust block 556 may be coupled to a RC calibration block 508. The bandwidth adjustment block 554 and the process compensation adjust block 556 may be placed in parallel to the base resistor 552. The process compensation adjust block 556 may be controlled based the values of input parameters $b_2$ and $b_3$, for example. The RC calibration block 508 may be enabled to set the values of $b_2$ and $b_3$ based on the amount of process or temperature variation.

Figure 5C:
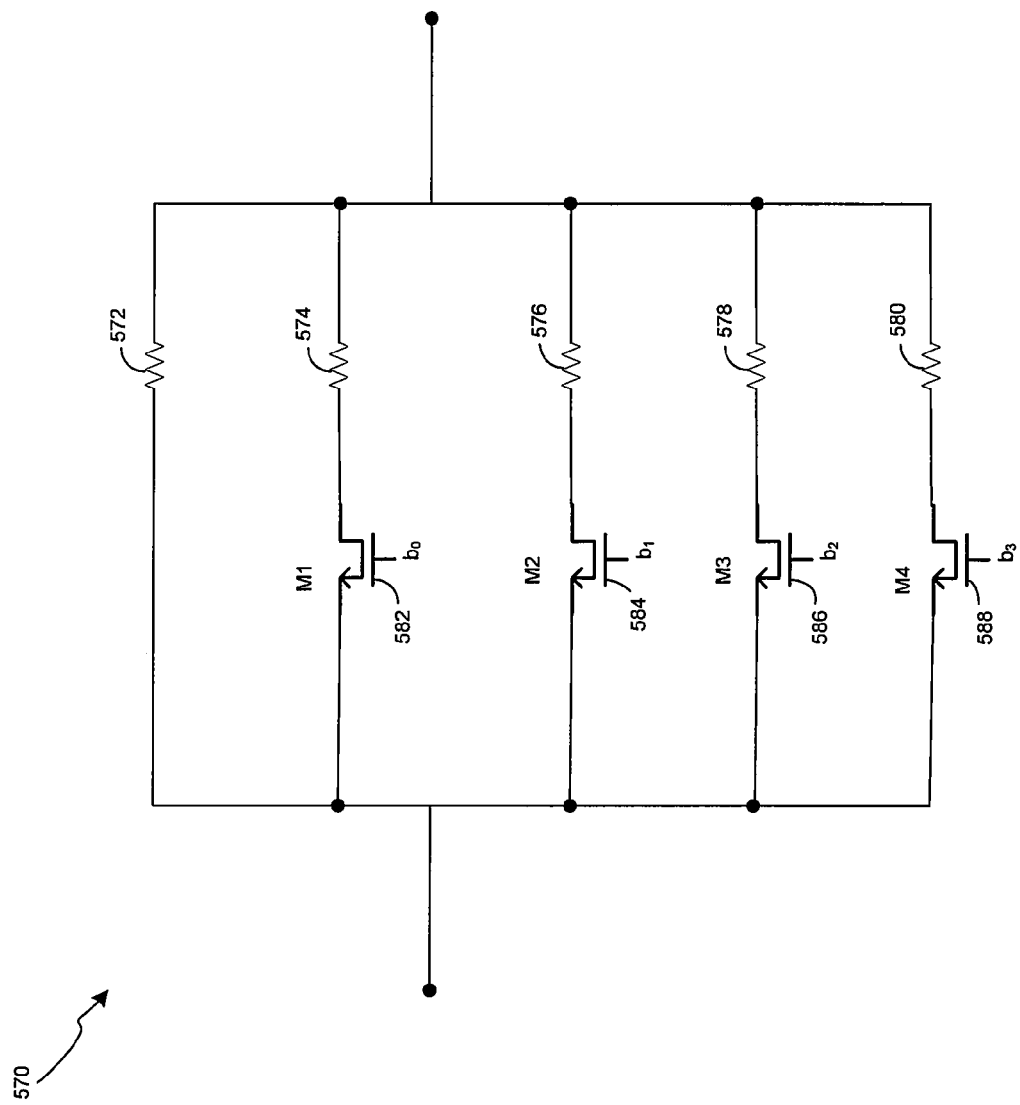
FIG. 5C is a circuit diagram of an exemplary portion of a resistor network with wideband coverage and process compensation, in accordance with an embodiment of the invention.

FIG. 5C is another block diagram of an exemplary portion of a resistor network with wideband coverage and process compensation, in accordance with an embodiment of the invention. Referring to FIG. 5C, there is shown a resistor network 570 that comprises a plurality of resistors 572, 574, 576, 578 and 580 in parallel, and a plurality of transistors M1 582, M2 584, M3 586, and M4 588 in parallel.

The drain of M1 582 may be coupled to the resistor 574. The gate of M1 582 may be coupled to the baseband processor 506. The gate of M1 582 may be controlled based on the value of the bit $b_0$. The drain of M2 584 may be coupled to the resistor 576. The gate of M2 584 may be coupled to the baseband processor 506. The gate of M2 584 may be controlled based on the value of the bit $b_1$. The drain of M3 586 may be coupled to the resistor 578. The gate of M3 586 may be coupled to the RC calibration block 508. The gate of M3 586 may be controlled based on the value of the bit $b_2$. The drain of M4 588 may be coupled to the resistor 580. The gate of M4 588 may be coupled to the RC calibration block 508. The gate of M4 588 may be controlled based on the value of the bit $b_3$. The sources of the plurality of transistors M1 582, M2 584, M3 586, and M4 588 may be coupled to the base resistor 572 and the input signal.

In an exemplary embodiment of the invention, if the frequency range of operation is between about 5.15 GHz to 5.4 GHz, the baseband processor 506 may be enabled to set the center frequency to 5.275 GHz by setting the bits $b_0$ and $b_1$ to 1 and 0 respectively, thereby adjusting the resistance of the resistor networks 570. Similarly, if the amount of process or temperature variation is 5%, the RC calibration block 508 may be enabled to adjust the resistance of the resistor networks 570 by setting the bits $b_2$ and $b_3$ to 0 and 0 respectively.

Figure 6:
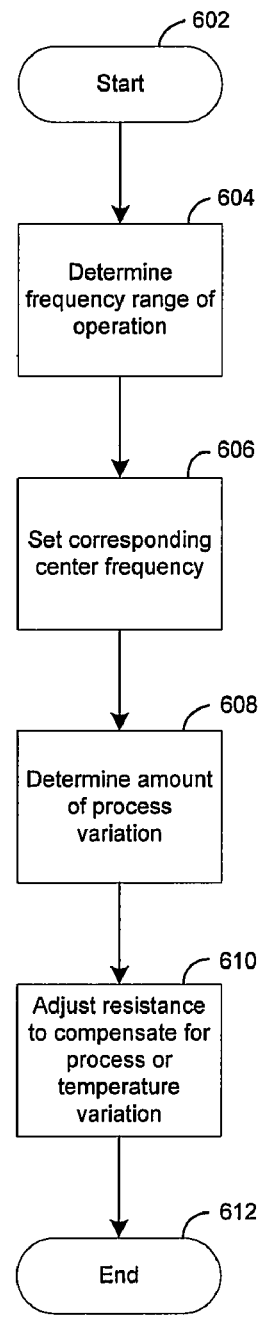
FIG. 6 is a flowchart illustrating exemplary steps for a RC-CR quadrature network with wideband coverage and process compensation, in accordance with an embodiment of the invention.

FIG. 6 is a flowchart illustrating exemplary steps for a RC-CR quadrature network with wideband coverage and process compensation, in accordance with an embodiment of the invention. Referring to FIG. 6, exemplary steps may begin at step 602. In step 604, the frequency range of operation of the RF transceiver 100 may be determined. In step 606, the baseband processor 506 may be enabled to set the center frequency to a corresponding value to reduce the I-Q amplitude mismatch by adjusting the value of a plurality of bits, $b_0$ and $b_1$. In step 608, the amount of process or temperature variation in the RF transceiver 100 may be determined. In step 610, the RC calibration block 508 may be enabled to compensate for the process or temperature variations in the RC-CR quadrature network 500 by adjusting the value of a plurality of bits, $b_2$ and $b_3$. Control then passes to end step 612.

In accordance with an embodiment of the invention, a method and system for RC-CR quadrature generation with wideband coverage and process compensation may include determining an amplitude mismatch between an in-phase (I) component and a quadrature (Q) component of a signal generated by a RF transmitter or receiver, for example, RF transceiver 100. The process, voltage or temperature variations in resistance of a quadrature network associated with the I component, for example, resistance of resistor network 503 and the Q component, for example, resistance of resistor network 505 may be determined. The determined amplitude mismatch and the determined process, voltage or temperature variations in resistance of the quadrature network may be compensated by adjusting the resistance of a portion of the quadrature network 500 associated with the I component, for example, resistance of resistor network 503 and the resistance of a portion of the quadrature network 500 associated with the Q component, for example, resistance of resistor network 505.

The RC-CR quadrature network 500 may be utilized to generate the I component and the Q component of the generated signal. The resistance of the quadrature network associated with the I component, for example, resistance of resistor network 503 and the Q component, for example, resistance of resistor network 505 may be adjusted by adjusting a value of one or more bits, for example, $b_0$, $b_1$, $b_2$, and $b_3$. The RC calibration block 508 may be enabled to compensate for the process or temperature variations in the RF transmitter or receiver, for example, RF transceiver 100 by adjusting the value of a plurality of bits, $b_2$ and $b_3$. The frequency range of operation of the RF transmitter or receiver, for example, RF transceiver 100 may be determined. The baseband processor 506 may be enabled to set the center frequency to a corresponding value to reduce the I-Q amplitude mismatch by adjusting the value of a plurality of bits, $b_0$ and $b_1$.

The determined amplitude mismatch and the determined process, voltage or temperature variations in resistance of the quadrature network may be compensated by adjusting the capacitance of a portion of the quadrature network 500 associated with the I component, for example, capacitance 510 and the capacitance of a portion of the quadrature network 500 associated with the Q component, for example, capacitance 524. The RC calibration block 508 may be enabled to calibrate the capacitance of a portion of the quadrature network 500 associated with the I component, for example, capacitance 510 and the capacitance of a portion of the quadrature network 500 associated with the Q component, for example, capacitance 524. The RC calibration block 508 may be enabled to calibrate the resistance of a portion of the quadrature network 500 associated with the I component, for example, resistance of resistor network 503 and the resistance of a portion of the quadrature network 500 associated with the Q component, for example, resistance of resistor network 505.

Another embodiment of the invention may provide a machine-readable storage, having stored thereon, a computer program having at least one code section executable by a machine, thereby causing the machine to perform the steps as described above for RC-CR quadrature generation with wideband coverage and process compensation.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
   determining an amplitude mismatch between an in-phase (I) component and a quadrature (Q) component of a signal generated in a radio frequency (RF) transceiver;
   determining a variation in resistance of a quadrature network associated with said I component and said Q component; and
   compensating one or both of: said determined amplitude mismatch and/or said determined variation in said resistance of said quadrature network by adjusting a resistance of a portion of said quadrature network associated with said I component and a resistance of a portion of said quadrature network associated with said Q component.

2. The method according to claim 1, wherein said adjusting compensates for variation in resistance of said quadrature network associated with said I component and said Q component due to one or more of: process variations, temperature variations, and/or voltage variations in said RF transceiver.

3. The method according to claim 1, further comprising generating said I component and said Q component of said generated signal utilizing said quadrature network.

4. The method according to claim 1, wherein said quadrature network comprises a plurality of resistors and capacitors.

5. The method according to claim 1, further comprising adjusting a value of one or more bits to adjust said resistance of said portion of said quadrature network associated with said I component and said resistance of said portion of said quadrature network associated with said Q component.

6. The method according to claim 5, wherein said determined variation in said resistance of said quadrature network is compensated based on said adjusted value of said one or more bits.

7. The method according to claim 1, further comprising determining a frequency range of operation of said RF transceiver.

8. The method according to claim 7, further comprising compensating for said determined amplitude mismatch by setting a particular center frequency based on said determined frequency range of operation of said RF transceiver.

9. The method according to claim 1, further comprising compensating one or both of: said determined amplitude mismatch and/or said determined variation in said resistance of said quadrature network by adjusting a capacitance of said portion of said quadrature network associated with said I component and a capacitance of said portion of said quadrature network associated with said Q component.

10. The method according to claim 9, further comprising calibrating one or both of: said capacitance of said portion of said quadrature network associated with said I component and said capacitance of said portion of said quadrature network associated with said Q component.

11. The method according to claim 1, further comprising calibrating one or both of: said resistance of said portion of said quadrature network associated with said I component and said resistance of said portion of said quadrature network associated with said Q component.

12. A system for processing signals, the system comprising:
one or more circuits that enables determination of an amplitude mismatch between an in-phase (I) component and a quadrature (Q) component of a signal generated in a radio frequency (RF) transceiver;
said one or more circuits enables determination of a variation in resistance of a quadrature network associated with said I component and said Q component; and
said one or more circuits enables compensation of one or both of: said determined amplitude mismatch and/or said determined variation in said resistance of said quadrature network by adjusting a resistance of a portion of said quadrature network associated with said I component and a resistance of a portion of said quadrature network associated with said Q component.

13. The system according to claim 12, wherein said adjusting compensates for variation in resistance of said quadrature network associated with said I component and Q component due to one or more of: process variations, temperature variations, and/or voltage variations in said RF transceiver.

14. The system according to claim 12, wherein said one or more circuits enables generation of said I component and said Q component of said generated signal utilizing said quadrature network.

15. The system according to claim 12, wherein said quadrature network comprises a plurality of resistors and capacitors.

16. The system according to claim 12, wherein said one or more circuits enables adjusting of a value of one or more bits to adjust said resistance of said portion of said quadrature network associated with said I component and said resistance of said portion of said quadrature network associated with said Q component.

17. The system according to claim 16, wherein said one or more circuits enables compensation for said determined variation in said resistance of said quadrature network based on said adjusted value of said one or more bits.

18. The system according to claim 12, wherein said one or more circuits enables determination of a frequency range of operation of said RF transceiver.

19. The system according to claim 18, wherein said one or more circuits enables compensation for said determined amplitude mismatch by setting a particular center frequency based on said determined frequency range of operation of said RF transceiver.

20. The system according to claim 12, wherein said one or more circuits enables compensation for one or both of: said determined amplitude mismatch and/or said determined variation in said resistance of said quadrature network by adjusting a capacitance of said portion of said quadrature network associated with said I component and a capacitance of said portion of said quadrature network associated with said Q component.

21. The system according to claim 20, wherein said one or more circuits enables calibration of one or both of: said capacitance of said portion of said quadrature network associated with said I component and said capacitance of said portion of said quadrature network associated with said Q component.

22. The system according to claim 12, wherein said one or more circuits enables calibration of one or both of: said resistance of said portion of said quadrature network associated with said I component and said resistance of said portion of said quadrature network associated with said Q component.

23. A non-transitory machine-readable storage medium having stored thereon, a computer program having at least one code section for processing signals, the at least one code section being executable by a machine for causing the machine to perform steps comprising:
determining an amplitude mismatch between an in-phase (I) component and a quadrature (Q) component of a signal generated in a radio frequency (RF) transceiver;
determining a variation in resistance of a quadrature network associated with said I component and said Q component; and
compensating one or both of: said determined amplitude mismatch and/or said determined variation in said resistance of said quadrature network by adjusting a resistance of a portion of said quadrature network associated with said I component and a resistance of a portion of said quadrature network associated with said Q component.

24. The non-transitory machine-readable storage medium according to claim 23, wherein said adjusting compensates for variation in resistance of said quadrature network associated with said I component and said Q component due to one or more of: process variations, temperature variations, and/or voltage variations in said RF transceiver.

25. The non-transitory machine-readable storage medium according to claim 23, wherein said at least one code section comprises code for generating said I component and said Q component of said generated signal utilizing said quadrature network.

26. The non-transitory machine-readable storage medium according to claim 23, wherein said quadrature network comprises a plurality of resistors and capacitors.

27. The non-transitory machine-readable storage medium according to claim 23, wherein said at least one code section comprises code for adjusting a value of one or more bits to adjust said resistance of said portion of said quadrature network associated with said I component and said resistance of said portion of said quadrature network associated with said Q component.

28. The non-transitory machine-readable storage medium according to claim 27, wherein said at least one code section comprises code for compensating for said determined variation in said resistance of said quadrature network based on said adjusted value of said one or more bits.

29. The non-transitory machine-readable storage medium according to claim 23, wherein said at least one code section comprises code for determining a frequency range of operation of said RF transceiver.

30. The non-transitory machine-readable storage medium according to claim 29, wherein said at least one code section comprises code for compensating for said determined amplitude mismatch by setting a particular center frequency based on said determined frequency range of operation of said RF transceiver.

31. The non-transitory machine-readable storage medium according to claim 23, wherein said at least one code section comprises code for compensating one or both of: said determined amplitude mismatch and/or said determined variation in said resistance of said quadrature network by adjusting a capacitance of said portion of said quadrature network associated with said I component and a capacitance of said portion of said quadrature network associated with said Q component.

32. The non-transitory machine-readable storage medium according to claim 31, wherein said at least one code section comprises code for calibrating one or both of: said capacitance of said portion of said quadrature network associated with said I component and said capacitance of said portion of said quadrature network associated with said Q component.

33. The non-transitory machine-readable storage medium according to claim 23, wherein said at least one code section comprises code for calibrating one or both of: said resistance of said portion of said quadrature network associated with said I component and said resistance of said portion of said quadrature network associated with said Q component.

\* \* \* \* \*